United States Patent

Serizawa

[11] Patent Number: 6,128,217
[45] Date of Patent: Oct. 3, 2000

[54] SEMICONDUCTOR MEMORY DEVICE

[75] Inventor: Kenichi Serizawa, Kanagawa, Japan

[73] Assignee: NEC Corporation, Tokyo, Japan

[21] Appl. No.: 09/431,271

[22] Filed: Nov. 1, 1999

[30] Foreign Application Priority Data

Oct. 30, 1998 [JP] Japan .................................. 10-310588

[51] Int. Cl.⁷ .......................... G11C 11/40; G11C 11/419
[52] U.S. Cl. .......................... 365/154; 365/156; 365/190
[58] Field of Search .................................. 365/154, 156, 365/190, 189.01, 203

[56] References Cited

U.S. PATENT DOCUMENTS

| | | | |
|---|---|---|---|
| 4,692,900 | 9/1987 | Ooami et al. | 365/63 |
| 5,068,828 | 11/1991 | Miyaoka et al. | 365/189.01 |

FOREIGN PATENT DOCUMENTS

| | | | |
|---|---|---|---|
| 7-192473 | 7/1995 | Japan | G11C 11/34 |
| 7-312089 | 11/1995 | Japan | G11C 11/34 |
| 11-250670 | 9/1999 | Japan | G11C 11/34 |

*Primary Examiner*—Son Mai
*Attorney, Agent, or Firm*—McGinn & Gibb, P.C.

[57] ABSTRACT

A semiconductor memory device in an SRAM using a 4 transistor-type memory cell which device includes an error writing protection circuit for preventing any information from being written into a memory cell into which any information is not needed to be written owing to line capacitance between adjacent bit lines. The error writing protection circuit includes an N-type transistors, a P-type transistor, and diodes. Hereby, it is determined whether or not a bit line is charged with electricity in accordance with electric potential of an adjacent bit line, and there is not charged with electricity a bit line for which there is no possibility of any information from being written, but there is charged with electricity only bit lines where there is possibility of any information being written in error. Thus, there is flowed no excess current.

10 Claims, 15 Drawing Sheets

SEMICONDUCTOR MEMORY DEVICE

BACKGROUND OF THE INVENTION

1. Field of the Invention

The present invention relates to a semiconductor memory device which is preferably used for SRAMs, etc.

2. Description of the Related Art

Semiconductor memory devices are becoming recently larger in capacity and higher in operation speeds, and are allowing finer designs.

The length of a bit line is therefore increased hereafter, so that an area of a parallel plate between adjacent wirings is increased and hence line capacitance between bit lines is increased.

As illustrated in FIG. 15, a distance between wirings is reduced by making the device further finer, so that line capacitance is increased, but capacitance other than the line capacitance is considered to be oppositely reduced.

In a product of 0.35 μm, when the length of a bit line becomes about 4 mm, line capacitance becomes 0.36 pF.

Although it is further considered that an operation speed of a product is increased and simultaneously multiple bit arrangement is promoted, provided such multiple bit arrangement is achieved, there is required a one-shot pulse generator for each I/O.

In Japanese Laid-Open Patent Application No. Hei11-250670, for example, a system is disclosed in which current consumption is reduced by charging a bit line with electricity using a one-shot pulse only when /WE changes from a high level to a low level and a data input (I/O) changes. The system however requires a one-shot pulse generator circuit for each /WE and for each of all I/Os to result in an increased chip area.

FIG. 5 is a block diagram illustrating a first prior art example of a general SRAM 100. The SRAM 100 includes a 4 transistor-type memory cell array 1, a row address decoder 3 for outputting a word line select signal 101 for selecting a word line of the memory cell data of which is inputted from an address buffer 2, a column address decoder 4 for selecting a bit line, a bit line control circuit 5 for reading/writing memory cell data, an output buffer 6 for outputting memory cell data, a data input buffer 7 for inputting memory cell data, a precharging circuit 8, and an address transition detection circuit 9.

The memory cell array 1 is arranged as illustrated in FIG. 6.

In the following, operation of the device will be described with reference to FIGS. 6 and 7 in which operation when line capacitance of the bit line is increased, erroneous writing into a memory cell happens.

It is assumed as initial writing electric potential of a memory cell of a memory array that electric potential on the side of D1 of memory cell M2 is at a high level, •electric potential on the side of /D1, electric potential on the side of D1 of memory cell M2 is at a low level, •electric potential on the side of D1 is at the high level, electric potential on the side of D2 of memory cell M4 is at the high level, •electric potential on the side of D2 is at the low level, electric potential on the side of D3 of memory cell M7 is at the low level, •electric potential on the side of D3 is at the high level, and electric potential on the side of D3 of memory cell M8 is at the high level and •electric potential on the side of D3 is at the low level.

It is further assumed that a word 1 is selected and is at the high level, and words 2, 3 are in a non-selection state and are at the low level, and further bit lines D2,/D2 are in a selection state with use of a row address decoder circuit.

As illustrated in FIG. 6, a memory cell array becomes a write state from a read state when /WE in FIG. 5 is changed from the high level to the low level.

DB, /DB are changed, whereby bit line D2 is changed from the high level to the low level, and bit line/D2 is changed from the low level to the high level (a state 1 in FIG. 7).

At this time, it is detected bit line D2 is changed from the high level to the low level, and the potential of /D1 becomes further lower from the low level, i.e., it becomes minus owing to line capacitance C2.

Operation of the memory cell M2 at this time will be described with reference to a general memory cell circuit diagram in FIG. 14.

Although electric potential of a gate of N-type transistor Qc in memory cell M2 at is the low level, the potential of /D1 becomes minus and exceeds threshold voltage in a conduction state.

Thereupon, the high level that is initial electric potential on the side of /D1 of memory cell M2 becomes low whereby data is written into memory cell M2 in error. In the same fashion, when data input (DIN) is changed from the low level to the high level, the bit line D2 is changed from the low level to the high level, while the bit line /D2 is changed from the high level to the low level (state 2 in FIG. 7).

In the same time interval the bit line /D2 is changed from the high level to the low level whereby the potential of D3 becomes further lower from than the low level owing to line capacitance C4. Even in this case, data is written in error in memory cell M8 in the same fashion as in the case where /WE is changed from the high level to the low level.

The SRAM as a second prior art, as shown in FIG. 8, includes an error writing protection circuit 10, N-type transistors Q13 to Q20, and a P-type transistor Q21 in addition to the components of the first prior art example illustrated in FIG. 6.

In the following, there will be described a memory cell illustrated in FIG. 8 together with a timing chart illustrated in FIG. 9.

Transistors Q13 to Q20 are very small ones such as those used in memory cells.

Gates and drains of Q13 to Q20 are connected with a drain of Q21, and sources of Q13 to Q20 are connected with each bit line.

For an input signal into Q21 there is used WEB that is the same phase signal as /WE.

The memory cell array becomes a write state from a read state when /WE is changed from the high level to the low level as in the aforesaid first prior art example.

Hereupon, the P-type transistor Q21 becomes conductive with the aid of the WEB signal to charge the drains and gates of N-type transistors Q13 to Q20 with electricity to the high level, and hence N-type transistors Q13 to Q20 become also conductive.

Thereupon, bit lines D1, /D1 to Dn having low electric potential are slightly charged with electricity. In the same time interval DB, /DB are changed to change bit line D2 to the low level from the high level and change bit line /D2 to the high level from the low level (state 1 in FIG. 9).

Hereupon, bit line D2 is changed from the high level to the low level whereby the electric potential /D1 becomes further lower from the low level, i.e., it becomes minus owing to line capacitance C2.

However, bit lines D1, /D1 to Dn, /Dn having low potential are slightly charged with electricity owing to P-type transistor Q21 and N-type transistors Q13 to Q20, so that /D1 is prevented from dropping from 0 V.

When the data input (DIN) changed from the low level to the hi gh level, bit line D2 is changed from the low level to the high level, and bit line /D2 is changed from the high level to the low level.

Since WEB is at the low level, bit lines D1, /D1 to Dn, /Dn having low potential are kept slightly charged with electricity owing to P-type transistor Q21 and N-type transistors Q13 to Q20 (state 2 in FIG. 9).

During the same time interval the bit line /D2 is changed from the high level to a low level whereby the potential of D3 becomes further lower from the low level owing to line capacitance C4.

However, bit lines D1, /D1 to Dn, /Dn having low potential are kept slightly charged with electricity owing to P-type transistor Q21 and N-type transistors Q13 to Q20 as described in the foregoing, so that D3 is prevented from lowering from 0 V.

More specifically, when the memory cell is in a write state, N transistors Q13 to Q20 and P-type transistors Q21 become conductive, and hence any signal is prevented from being written in error by charging the bit lines at low levels with electricity.

However, N-type transistors Q13 to Q20 and P-type transistor Q21 are kept conductive at all times when the memory cells are in a write state, so that a regulated current is conducted through all bit lines that are at the low level to cause large current consumption. 1 M bit products consume about 5 mA ar 5.5 V.

FIG. 11 illustrates an SRAM in Japanese Laid-Open Patent Application No. Hei11-250670 previously described as a third prior art example.

As shown in FIG. 10, this SRAM includes aforesaid error writing protection circuit 10 and the one-shot pulse generator circuit 11 provided additionally to those provided in FIG. 6.

FIG. 12 illustrates the arrangement of the one-shot pulse generation circuit 11. In the following, there will be described the memory cell array illustrated in FIG. 11 together with a timing chart illustrated in FIG. 13.

The one-shot pulse generation circuit 11 generates a one shot pulse (hereinafter, simply referred to as WEQ.) from the one-shot pulse signal WEQ generation circuit 41 illustrated in FIG. 12 when /WE is changed from the read to write state (becomes the low level from the high level).

The one-shot pulse generation circuit 11 further generates a one shot pulse (hereinafter, simply referred to as DEQ.) from one shot pulse signal DEQ generation circuit 42 illustrated in FIG. 12 when the data input signal DIN is changed from the high level to the low level or when the same is changed from the low level to the high level.

In FIG. 11, the error writing protection circuit 10 comprises N-type transistors Q13 to Q20 and P-type transistors Q21, Q22. Gates and drains of Q13 to Q20 are connected with drains of Q21 and Q22, and sources thereof are connected with their spective bit lines. Into the gate of Q21 foregoing WEQ is inputted, and into the gate of Q22 aforesaid DEC is inputted.

In the same manner as the aforesaid prior art example, when /WE is changed from the high level to the row level, the memory cell array becomes the write state from the read state.

Thereupon, a one-shot pulse is generated from aforesaid WEQ generation circuit 41 to charge with electricity the drains and gates of N-type transistors Q13 to Q20 to the high level with the aid of P-type transistor Q21 into a conduction state.

Thereupon, the bit lines of D1, /D1 to Dn, /Dn having low potential are slightly charged with electricity. During the same time interval DB, /DB are changed, whereby bit line D2 is changed from high level to low level while bit line /D2 is changed from low level to high level (state 1 in FIG. 13).

Hereupon, owing to a change of bit line D2 from high to low level the potential of /D1 becomes further lower, i.e., it becomes minus from the low level owing to line capacitance C2.

However, as described previously, bit lines D1, /D1 to Dn, /Dn having low potential have been slightly charged with the aid of the one shot pulse generated from WEQ generation circuit 41, whereby /D1 is prevented from lowering from 0 V.

The time to charge the bit lines with electricity continues only during the time interval the one shot pulse WEQ has been generated, so that no current flows steadily. With the above arrangement, the memory cell can be prevented from being erroneously written without flowing a current steadily with the aid of the line capacitance. A 1 Mbit product consumes a current of about 50 $\mu$A at 5.5 V.

Then, when the data input (DIN) is changed from the low level to the high level, bit line D2 is changed from the low level to the high level, while bit line /D2 is changed from the high level to the low level.

At this time a one-shot pulse is generated from aforesaid DEQ generation circuit 42, whereby drains and gates of P-type transistor Q22 and N-type transistors Q13 to Q20 are charged with electricity to the high level into a conduction state.

Thereupon, bit lines of D1, /D1 to Dn, /Dn having low potential are slightly charged ith electricity (state 2 in FIG. 13.). During the same time interval bit line /D2 is changed from high level to low level, whereby the potential D3 becomes further lower from the low level.

However, bit lines D1, /D1 to Dn, /Dn having low potential has been changed slightly owing to the one shot pulse generated from aforesaid DEQ generation circuit 42, D3 can be prevented from lowering from 0V.

Further, the time to charge the bit lines with electricity continues only during the time interval the one shot pulse DEQ has been generated, so that no current flows steadily.

With the aforesaid arrangement, any memory cell can be prevented from being erroneously written with the aid of line capacitance without flowing a current steadily.

However, such a one-shot pulse generation circuit as illustrated in FIG. 12 is necessary for each /WE and each I/O in order to generate a one shot pulse to result in a large chip area. In the circuit illustrated in FIG. 12, there are needed 12 transistors to generate WEQ and 22 transistors to generate DEQ for both of the P and N-type transistors.

In an 8 I/O product, there are required the sum total of 188 transistors to generate DEQ.

As described above, in the prior art SRAM, a memory cell can be prevented from being written in error owing to line capacitance by providing an error writing protection circuit. Further, a memory cell can be prevented from being written in error owing to line capacitance without flowing a current steadily by providing a one shot pulse generation circuit.

The prior art semiconductor memory device, however, suffers from a difficulty that a circuit scale becomes larger and current consumption is not yet enough reduced.

SUMMARY OF THE INVENTION

In view of the above difficulties, it is an object of the present invention to provide a semiconductor memory device wherein a circuit scale is reduced and current consumption is reduced.

According to a first aspect of the present invention, there is provided a semiconductor memory device provided with an error writing protection circuit, said error writing protection circuit having:

a pair of N-type transistors provided between a pair of bit lines;

a plurality of diodes, each diode connected with each of the N-type transistors; and a driving P-type transistor connected with the diode; and wherein the error writing protection circuit is adapted between the pair of bit lines in a cross-shape, charges an adjacent bit line in accordance with electric potential of a memory cell when writing data in the memory cell.

Also, in accordance with a second aspect of the present invention, a semiconductor memory device includes an error writing protection circuit in which a bit line is charged upon writing any information into a memory cell to prevent another memory cell from being written in error owing to line capacitance between adjacent bit lines, and the error writing protection circuit may be adapted such that decision of whether or not the aforesaid bit line is charged is executed in accordance with electric potential of the adjacent bit lines and may be constructed with a pair of N-type transistors between the bit lines, diodes each being connected with each N-type transistor, and a driving P-type transistor.

In the foregoing aspects, when the bit line of the memory cell on the aforesaid side to be written is changed from high to low, the the bit line having low potential of the memory cell on the side not to be written may be slightly charged with electricity.

Further, the aforesaid plurality of bit lines has the same address but have separate I/Os, and the aforesaid error writing protection circuit may be provided for only the bit line for which the column address is changed.

The aforesaid memory cell may comprise four transistors, which memory cell may be used to integrate into the SRAM.

With the above configuration, data writing error (crosstalking) can be prevented owing to wiring capacitance between the adjacent bit line and the memory cell.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

In what follows, there will be described preferred embodiments of the present invention with reference to the accompanying drawings.

Figure 1:
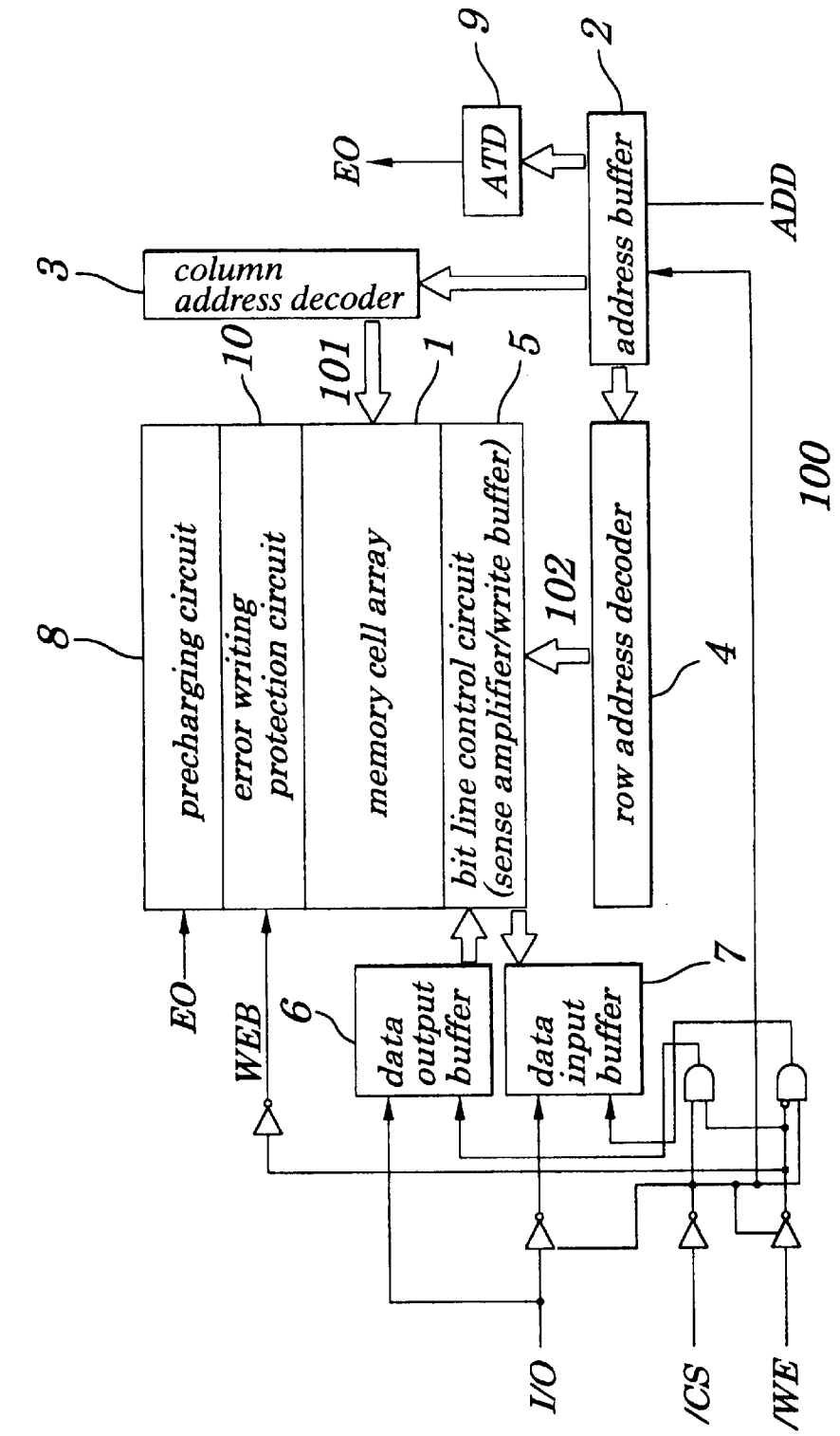
FIG. 1 is a circuit block diagram illustrating the construction of an SRAM as a semiconductor memory device according to preferred embodiments of the present invention.

In the present preferred embodiments, there will be first described the first preferred embodiment of the present invention with reference to FIG. 1 in which an SRAM 100 is illustrated in the form of a circuit block diagram.

The SRAM 100 includes a 4 transistor-type memory cell array 1 for storing data, column.

An address decoder 3 for outputting a word line select signal 101 for selecting any word line of the memory cell data of which is inputted from address buffer 2, a row address decoder 4 for selecting any bit line, a bit line control circuit 5 for reading and writing any memory cell dada, a data input buffer 7 for inputting any memory cell data and a data output buffer 6 for outputting any memory cell data, a precharging circuit 8, an address transition circuit 9, and an error writing protection circuit 10.

Figure 2:
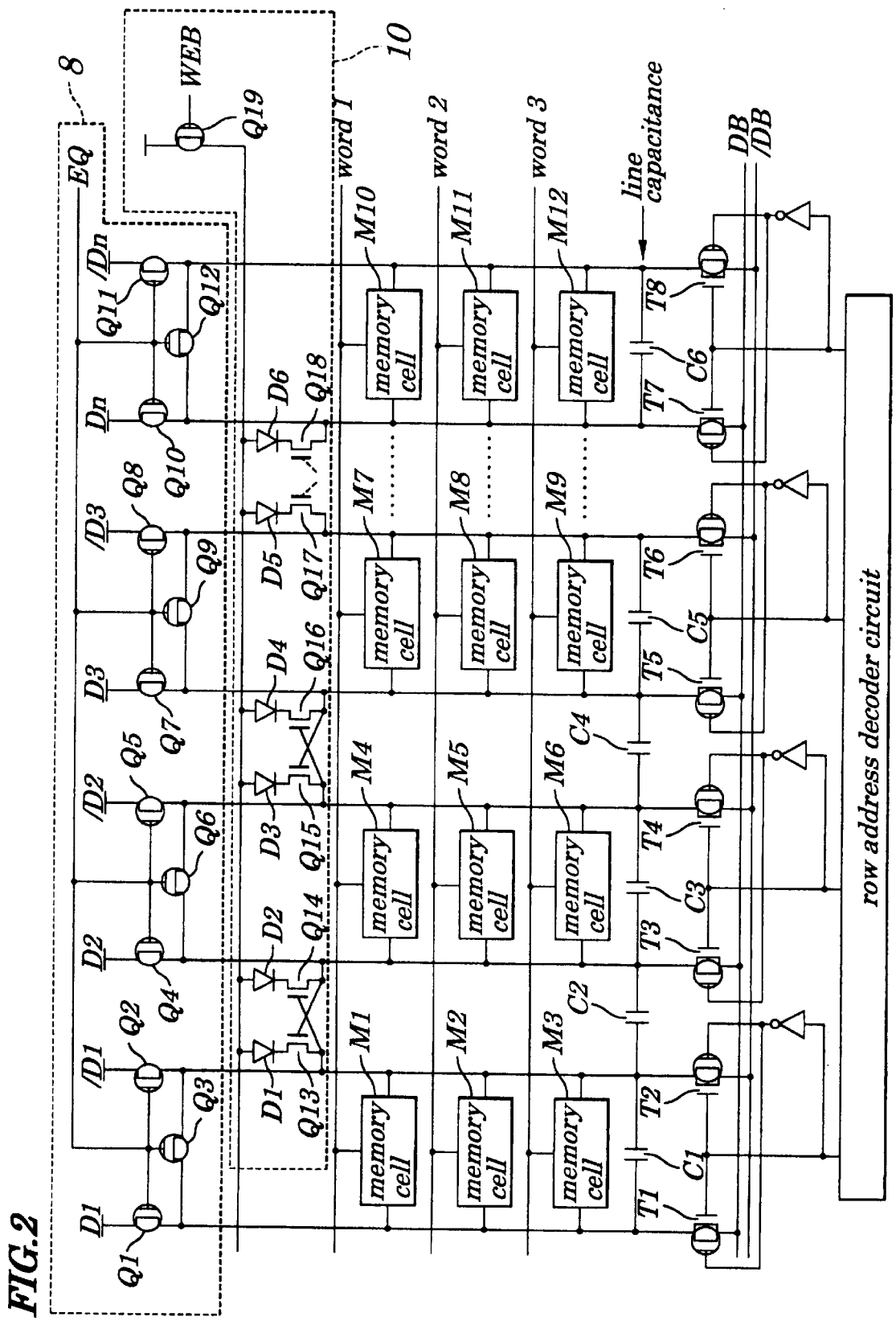
FIG. 2 is a circuit block diagram of a memory cell according to the first embodiment of the present invention.

FIG. 2 illustrates internal construction of the memory cell array, in which there is provided an error writing protection circuit 10 constructed with P-type transistors, N-type transistors, and diodes.

There are employed an input signal for controlling write or read operation for SRAM 100.

As illustrated in FIG. 2, the error writing protection circuit 10 is constructed with N transistors Q13 to Q18, P-type transistor Q19, and diodes D1 to D6.

Gates of Q13 to Q 18 are connected with adjacent bit lines with drains connected with cathodes of the diodes and with sources connected with the bit lines. Transistors Q13 to Q18 are constructed with very small transistors such as those used in the memory cell.

Driving transistor Q19 allows its gate to take WEB as an input and its drain is connected with anodes of the diodes. Q1 to Q12 constituting precharging circuit 8 comprise P-type transistors, gates of which take a one-shot pulse signal (hereinafter, simply referred to as EQ.) that is generated when the address is changed.

Figure 14:
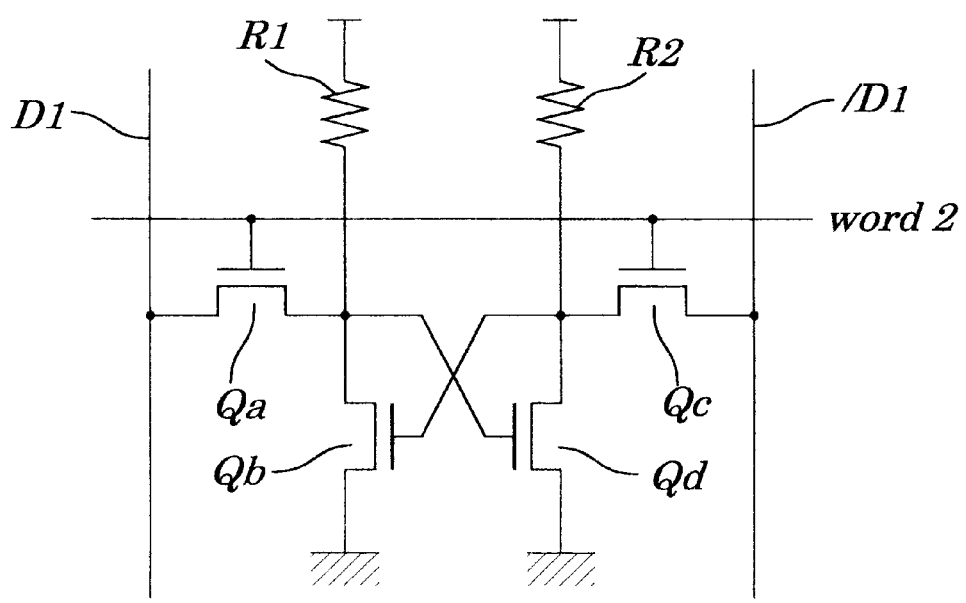
FIG. 14 is a circuit diagram showing conventionally general SRAM.
Figure 15:
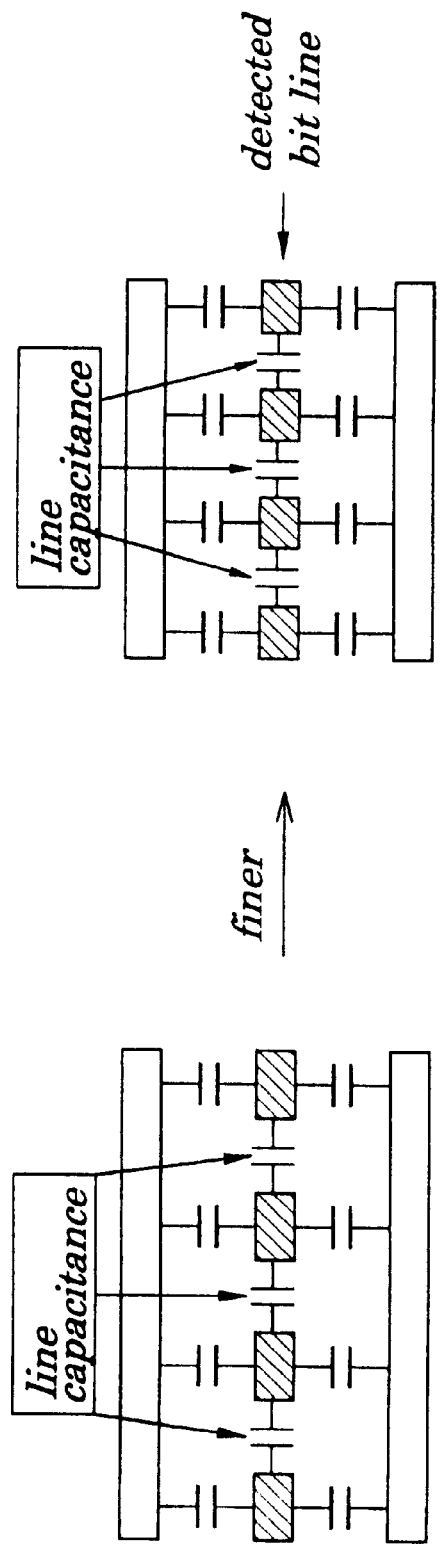
FIG. 15 is a view illustrating line capacitance.

Each of memory cells M1 to M12 is a 4 transistor-type SRAM memory cell as illustrated in FIG. 14. Each of C1 to C6 designates line capacitance which is capacitance between a noticed bit line and an adjacent bit line as illustrated in FIG. 15.

T1 to T8 are transfer gates each for bit line selection/non-selection controlling transfer gates.

In the following, operation of the aforesaid construction will be described with reference to FIGS. 2 and 3.

In the memory cell array of FIG. 2, it is assumed as initial writing electric potential of the memory cell that electric potential on the side of D1 of memory cell M1 is at the high level, electric potential on the side of /D1 is at the low level, electric potential on the side of D1 of memory cell M2 is at the low level electric potential on the side of /D1 is at the high level, electric potential on the side of D2 of memory cell M4 is at the high level electric potential on the side of /D2 is at the low level, electric potential on the side of D3 of memory cell M7 is at a low level electric potential on the side of /D3 is at the high level, and electric potential on the side of D3 of memory cell M8 is at the high level and electric potential on the side of /D3 is at the low level.

It is further assumed that a word 1 is selected to be at the high level, and words 2, 3 are not selected to be at the low level, and that bit lines D2, /D2 are selected with use of the row address decoder circuit.

Bit line D1 is at the high level, /D1 is at the low level (because of selection of the memory cell M1), and bit line D2 is at the high level,/D2 is at the low level(because of selection of memory cell M4), further D3 is at the low level and /D3 is at the high level(because of selection of memory cell M7).

Herein, the high level represents a power supply voltage, and the low level is 0 V.

It is now assumed that the initial state is a read state (/WE is the high level.), and the word 1 is selected as described in the foregoing.

Because of the read state, WEB is the high level, and Q19 is in a non-conduction state.

Then, it is assumed that there is no change in the address and /WE is changed from the high level to a low level.

Hereupon, the memory cell array becomes the write state from the read state.

However, the word 1 is kept at the high level because there is no address change.

Owing to WEB being an in-phase signal with /WE P-type transistor Q19 becomes conductive and hereby the anodes of diodes D1 to 6 are charged with electricity to the high level.

Thereupon, although the drains of N-type transistors Q13 to Q18 are charged with electricity to the high level, there becomes conductive only Q13 with the gate input electric potential being at the high level while there is kept non-conductive Q14 to 16 with the gate input electric potential being at the low level (conduction and non-conduction of Q17, Q18 are determined by the levels of the adjacent bit lines.).

Thereupon, the low level electric potential of bit line /D1 is slightly charged with electricity.

However, since Q13 is a very small transistor, the memory cell is not inverted.

Figure 3:
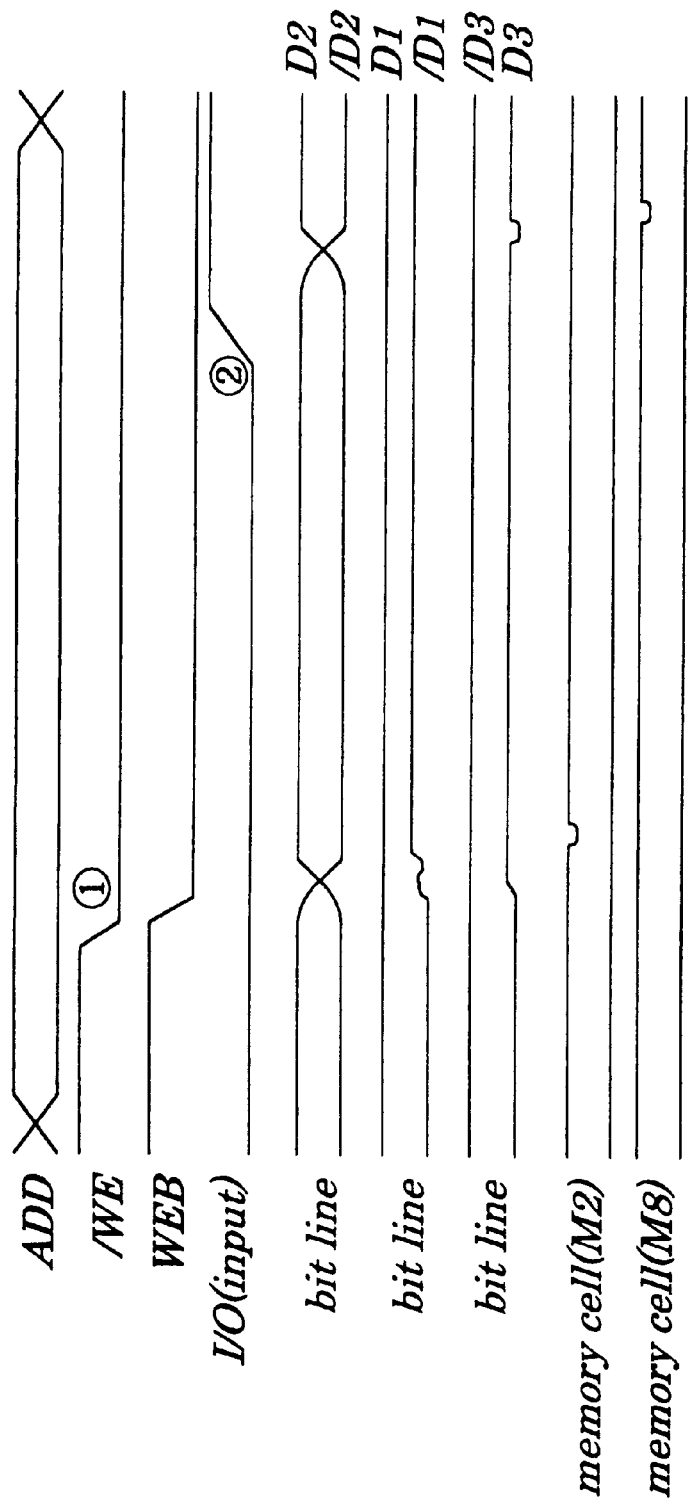
FIG. 3 is a timing chart illustrating operation of the first embodiment.

In the same time interval, when data to be written into memory cell M4 is reversed to the initial electric potential that is read data from memory cell M4, the data input signal DB is changed from the high level to the low level while /DB is changed from the low level to the high level, and bit line D2 is changed from the high level to the low level while /DB is changed from the low level to the high level (state 1 in FIG. 3).

Hereupon, bit line D2 is changed from the high level to the low level, whereby the potential /D1 becomes further lower from the low level, i.e., it becomes minus owing to the line capacitance C2.

Operation of memory cell M2 at this time will be described.

Electric potential of the gate of Qc that is an N-type transistor in memory cell M2 is at the low level, but when the potential of /D1 becomes minus and exceeds threshold voltage, Qc becomes conductive.

Thereupon, the high level that is the initial electric potential of memory cell M2 on the side of /D1 becomes low to invert the data in memory cell M2 hereby making it impossible to hold any data.

However, the bit line /D1 having low potential has been slightly charged with electricity with the WEB signal as described in the foregoing, and hereby /D1 is prevented from being lowered from 0 V.

This happens when the electric potential of the adjacent bit line (D2 in the previous case) is at the high level and the bit line of itself (/D1 in the previous case) is at the low level.

In the present embodiment, for the bit line to be charged with electricity no excess current is flowed to charge the bit line with electricity by charging with electricity only the bit line (/D1 in the previous case) for which the memory cell might be erroneously written with any data owing to the line capacitance while by not charging the bit line (D3 in the previous case) for which there is no possibility that the memory cell might be erroneously written.

Q19 is non-conductive if the operation is in the read state (/WE is at the high level) when the adjacent bit lines are both at the high level, so that the anodes of D1 to D6 are at the low level.

If there are not existent the diodes D1 to D6 at this time, it may be that the high level of the bit line is changed to the low level.

There is eliminated such a possibility that the bit line is changed from the high to low level provided diodes D1 to D6 are incorporated.

When the data input (I/O) is changed from the low to high level, the bit line D2 is changed from the low to high level, while bit line /D2 is changed from the high to low level.

Since /WE is at the low level at this time, WEB is also at the low level in the same fashion, whereby the anodes of diodes D1 to D6 are charged with electricity to the high level through P-type transistor Q19.

Thereupon, although the drains of N-type transistors Q13 to Q18 are charged with electricity to the high level, only Q16 with the gate input electric potential being at a high level becomes conductive, while Q13 to Q15 with the gate input electric potential being at the low level are kept non-conductive (conduction and non-conduction of Q17, Q18 are determined by levels of the adjacent bit lines).

Herein, the bit line D3 having low potential is slightly charged with electricity. However, since Q16 is very small, it can not invert the memory cells (state 2 in FIG. 3).

In the same time interval, bit line /D2 is changed from the high to low level, whereby the electric potential of the DS becomes further lower owing to line capacitance C4.

Also in this case, in the same fashion as in memory cell M2 when /WE is changed from the high to low level, data in memory cell M8 is sometimes inverted.

This happens when electric potential of the adjacent bit line (/D2 in the foregoing case) is at the high level, and the bit line of itself (D3 in the foregoing case) is at the low level.

In the present embodiment, for bit lines to be charged with electricity there is charged with electricity only a bit line (D3 in the previous case) with which any information might be written in error into the memory cells owing to line capacitance while there is not charged with electricity a bit line (/D1 in the foregoing case) with which no information might be written in error into the memory cells, whereby no excess current is flowed to charge the bit lines.

More specifically, a current to charge the bit lines with electricity becomes zero (0) when electric potentials of the adjacent bit lines are equal to each other as in the cases where D1 is at the high level, /D1 is at the low level, D2 is at the low level, /D2 is at the high level, D3 is at the high level and /D3 is at the low level.

Figure 4:
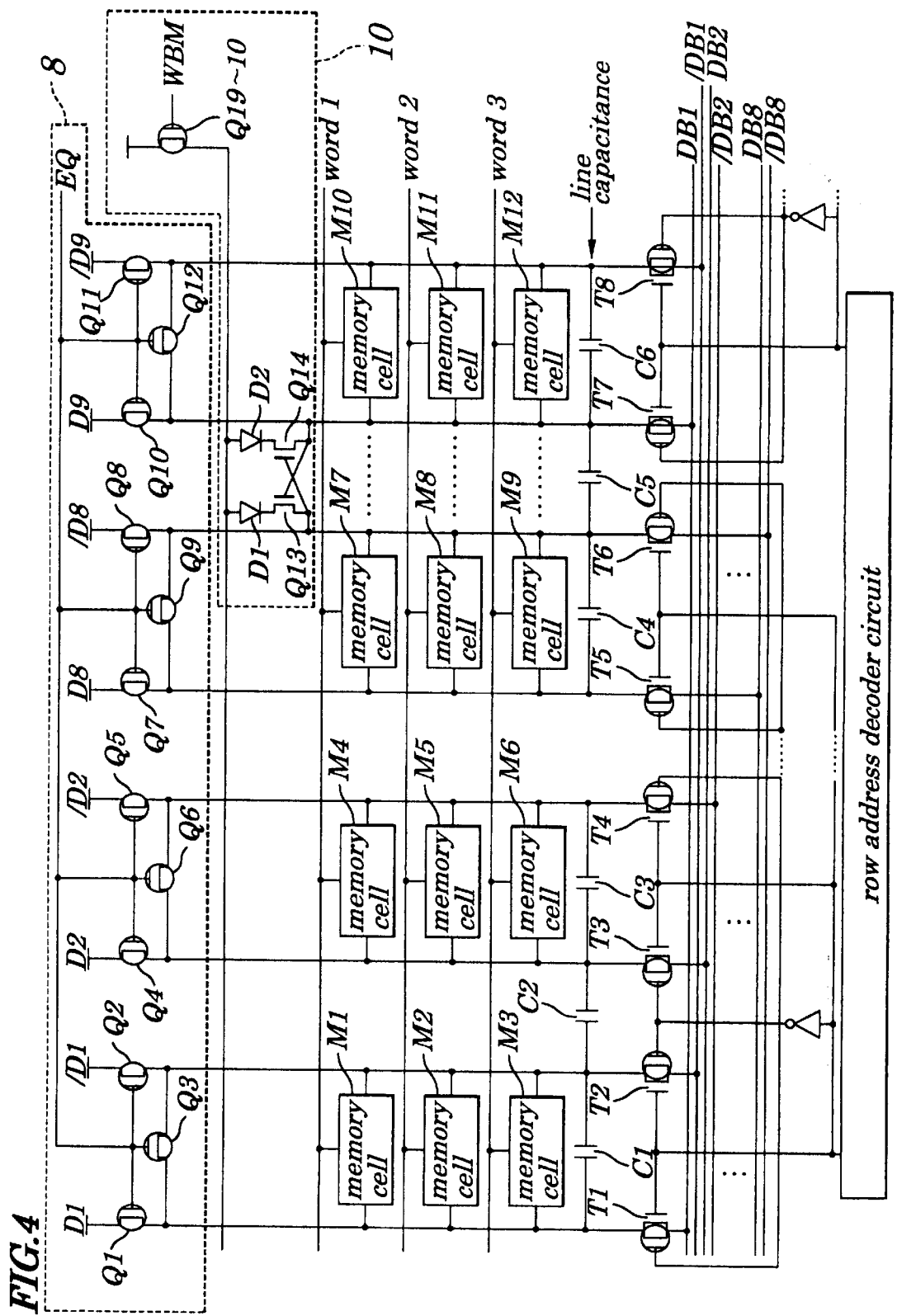
FIG. 4 is a circuit block diagram of a memory cell array according to the second embodiment of the present invention.
Figure 5:
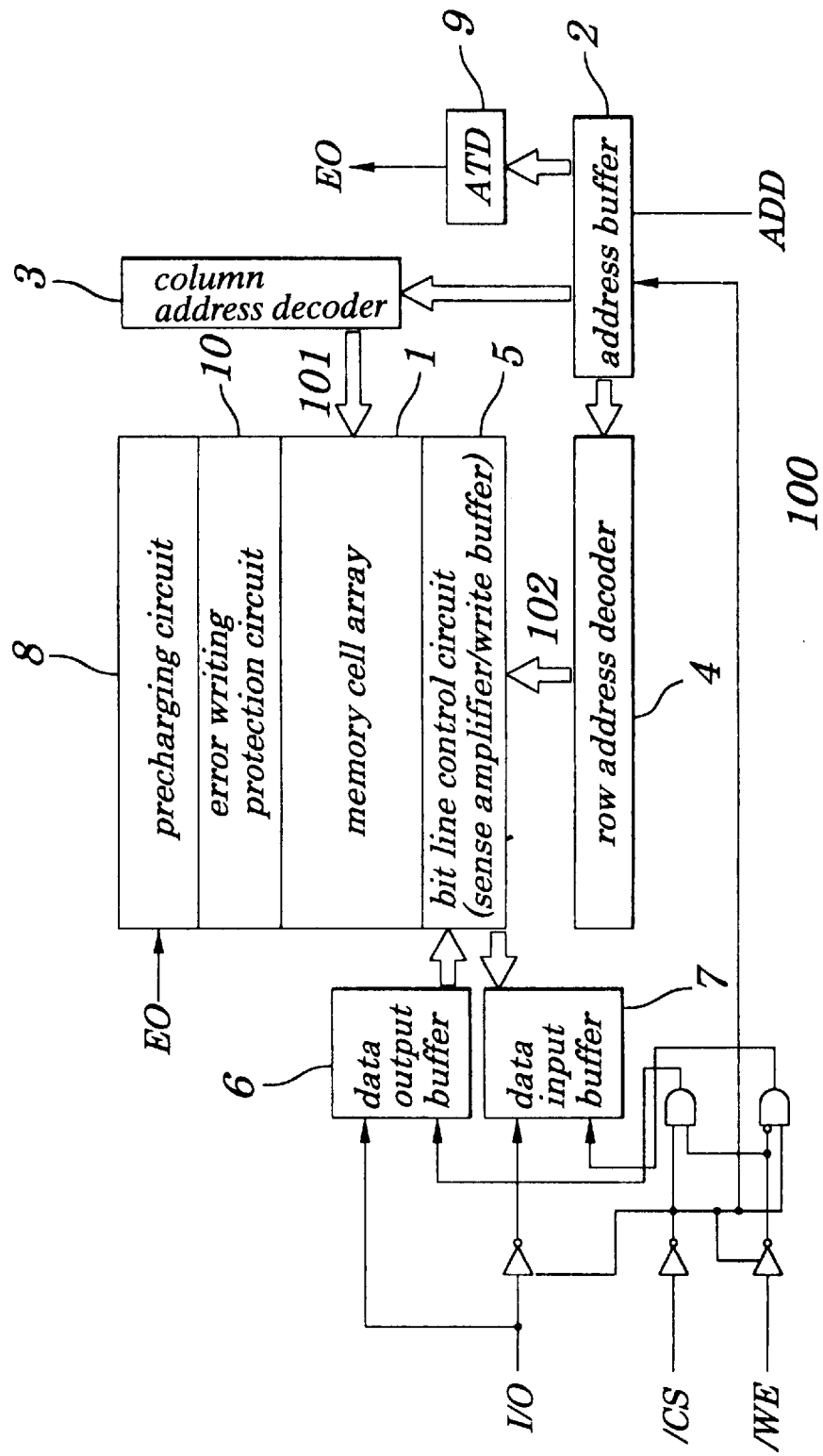
FIG. 5 is a circuit block diagram illustrating an SRAM as a first prior art.
Figure 6:
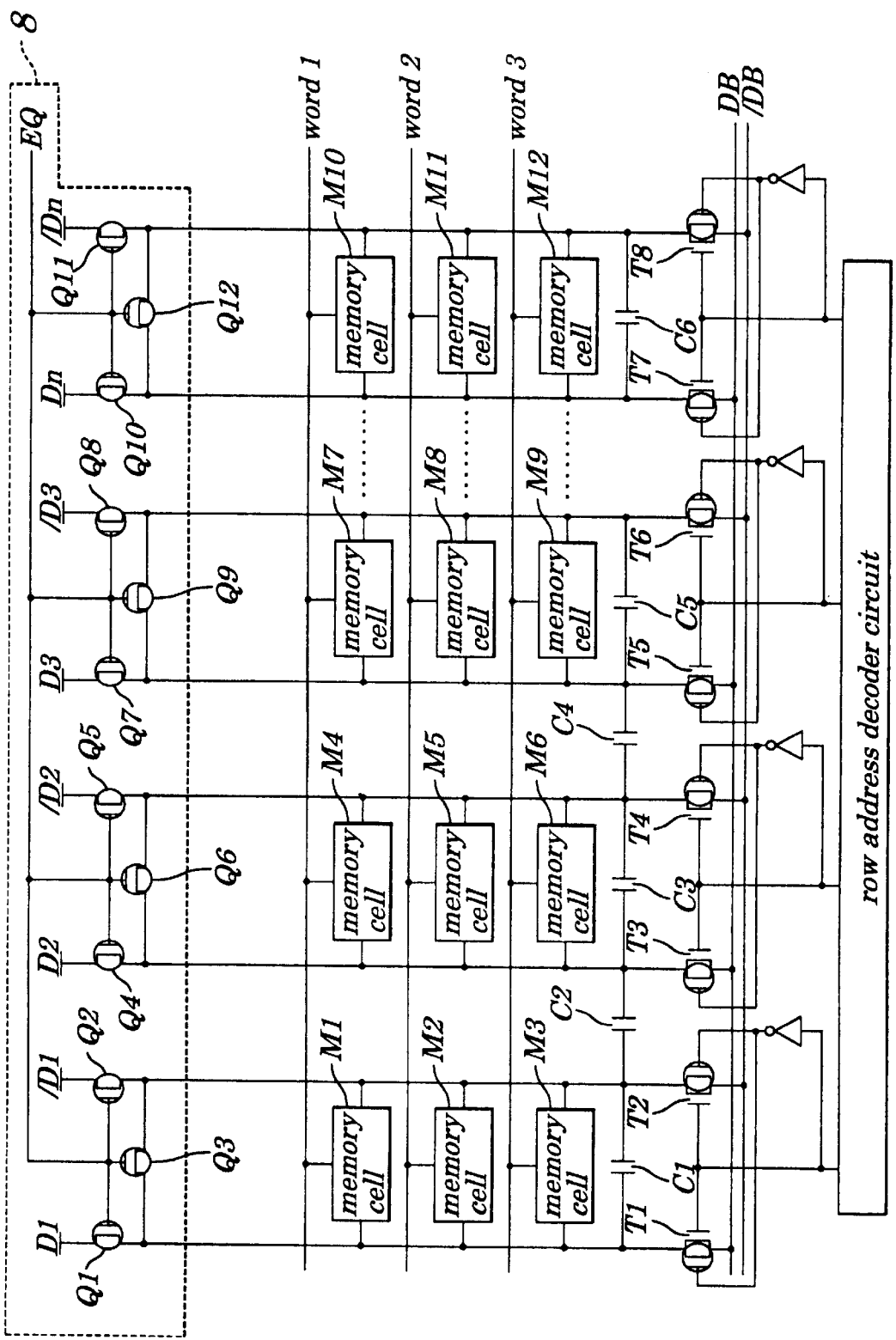
FIG. 6 is a circuit block diagram showing a memory cell array of the SRAM as the first prior art.
Figure 7:
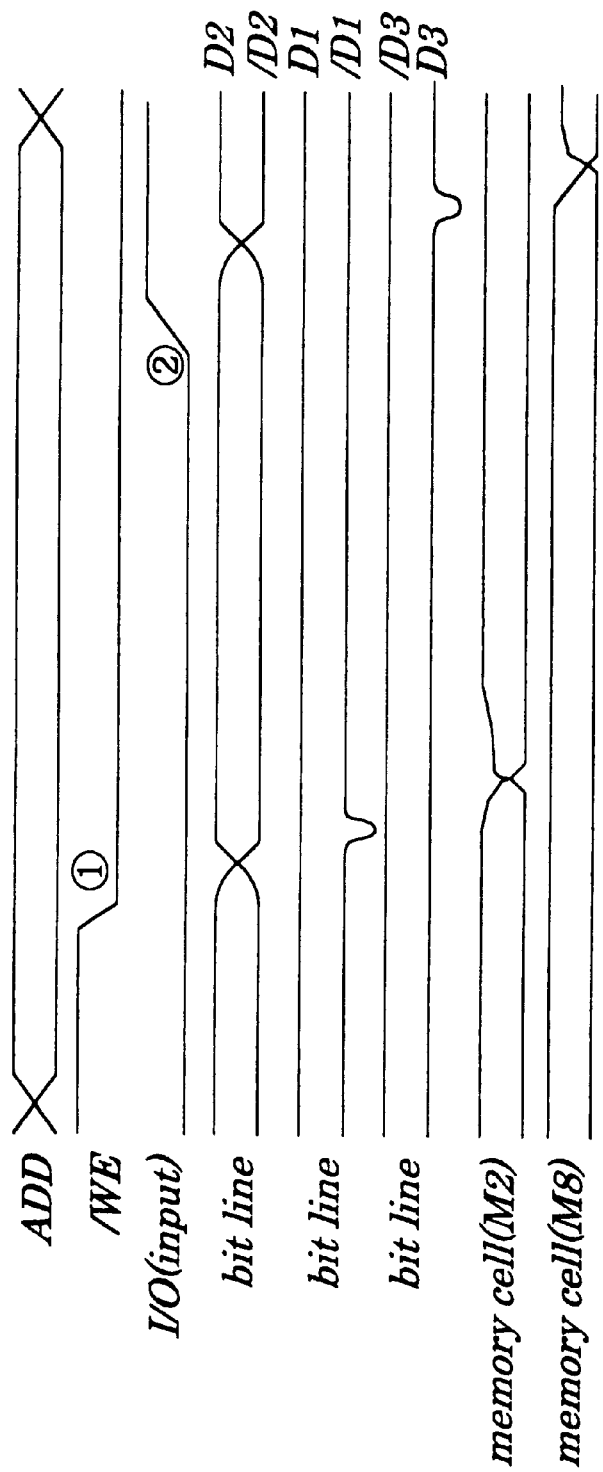
FIG. 7 is a timing chart illustrating operation of the SRAM as the first prior art.
Figure 8:
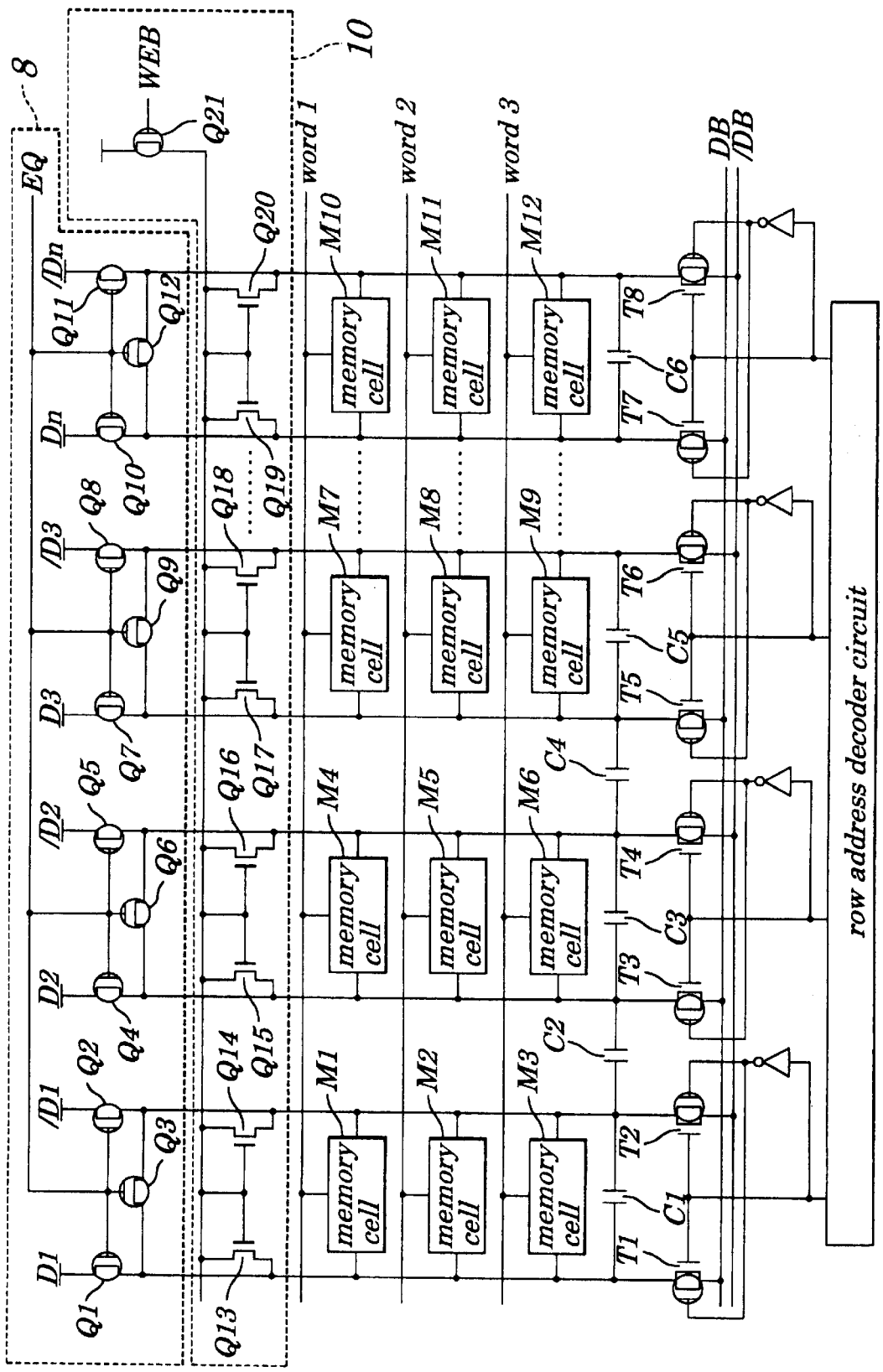
FIG. 8 is a circuit block diagram showing a memory cell of an SRAM as a second prior art.
Figure 9:
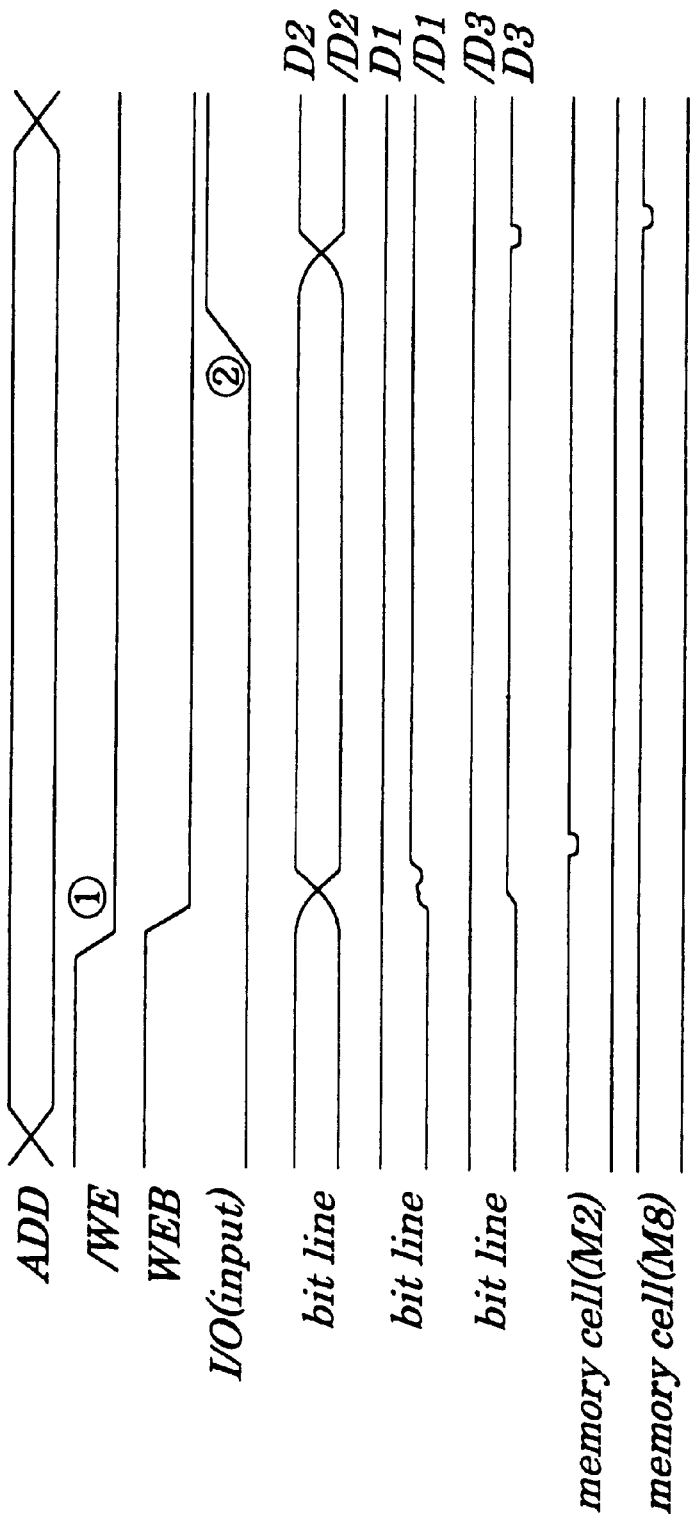
FIG. 9 is a timing chart illustrating operation of the SRAM as the second prior art.
Figure 10:
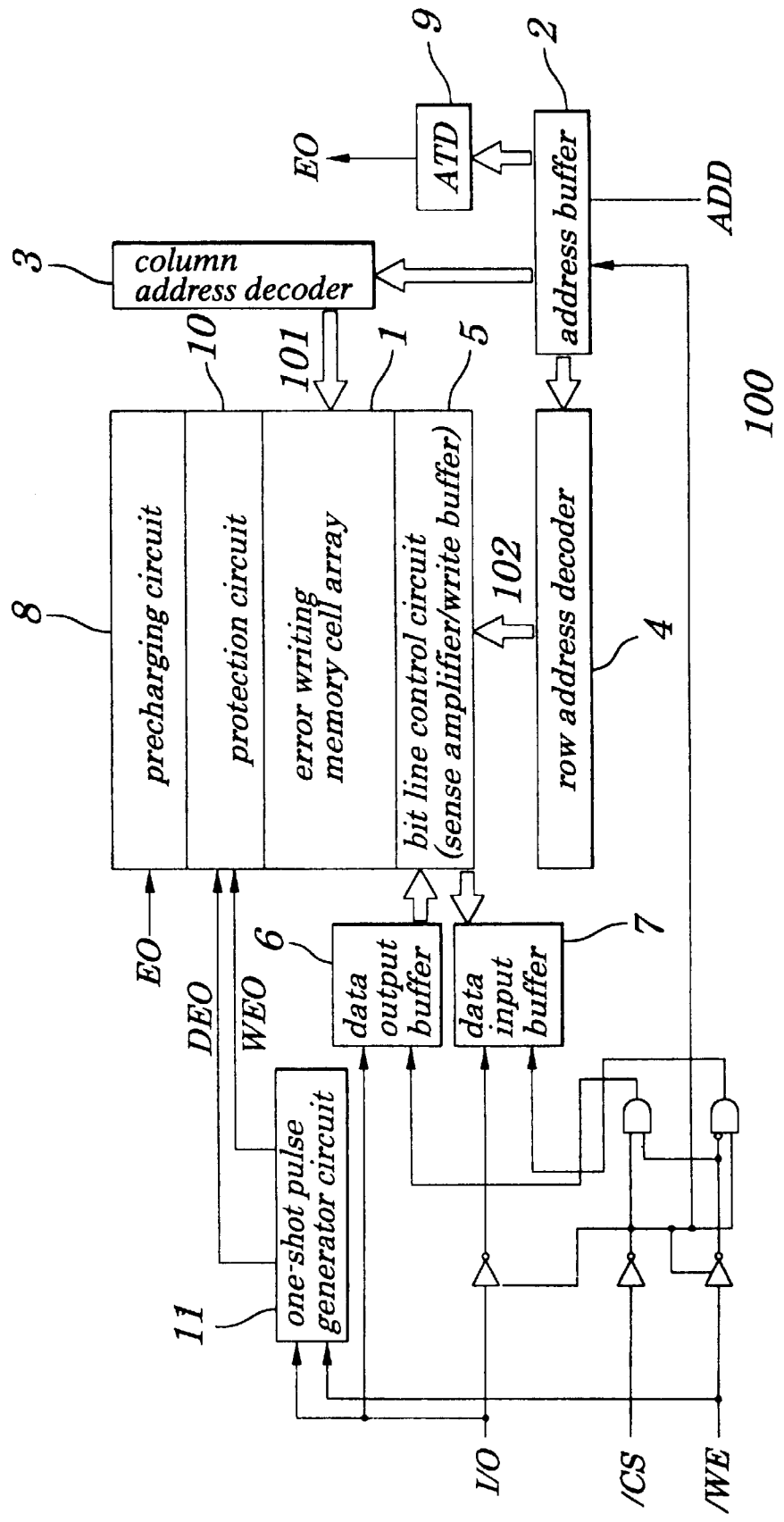
FIG. 10 is a circuit block diagram illustrating the SRAM as a third prior art.
Figure 11:
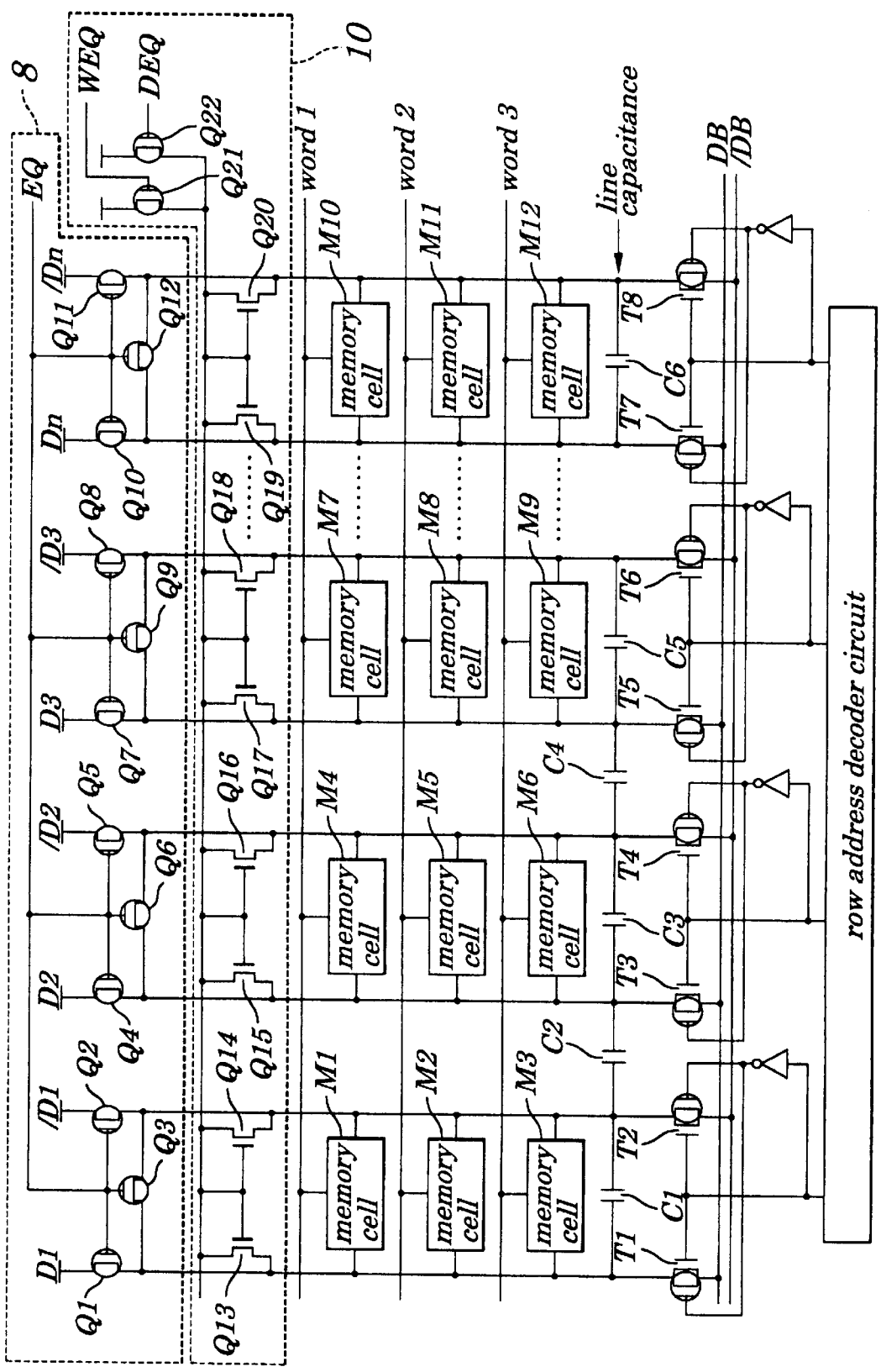
FIG. 11 is a circuit block diagram showing a memory cell array of SRAM as the third prior art example.
Figure 12:
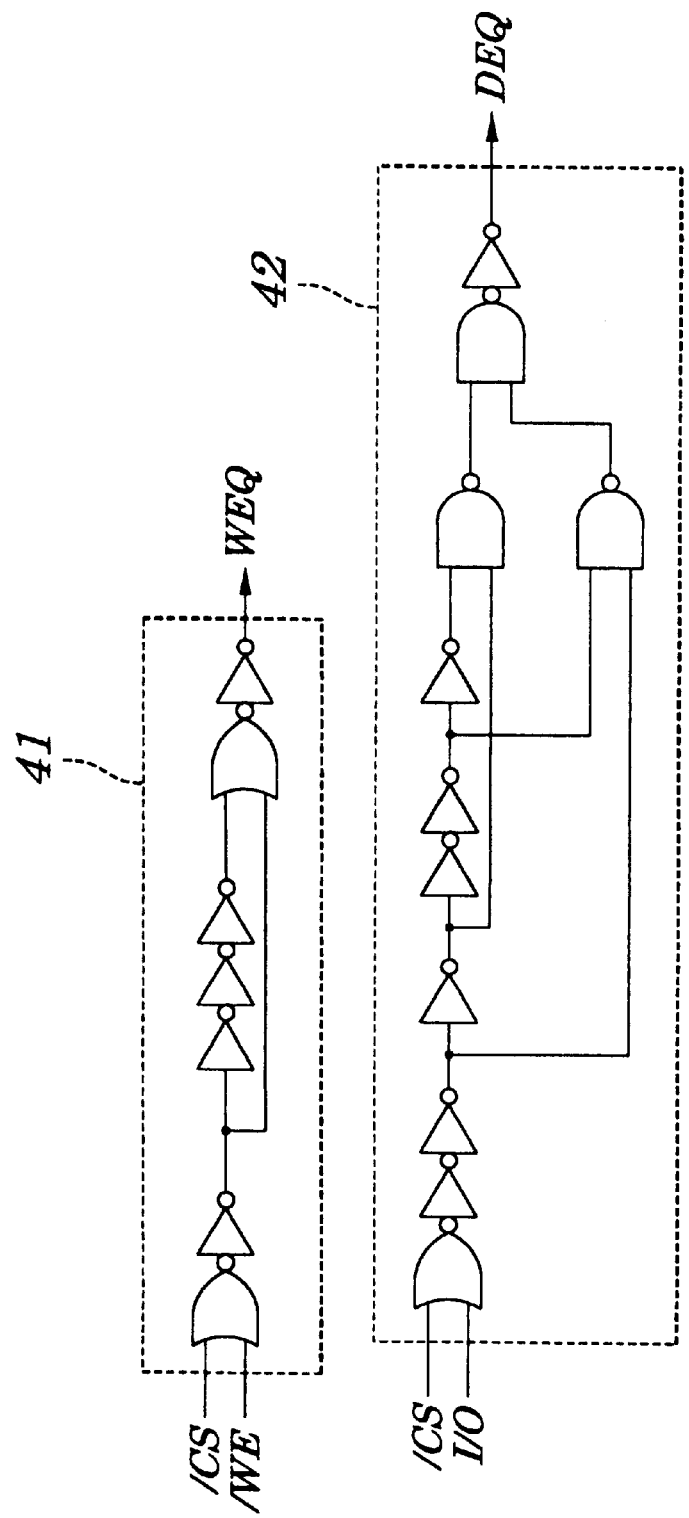
FIG. 12 is a circuit diagram showing conventional one shot pulse generation circuit
Figure 13:
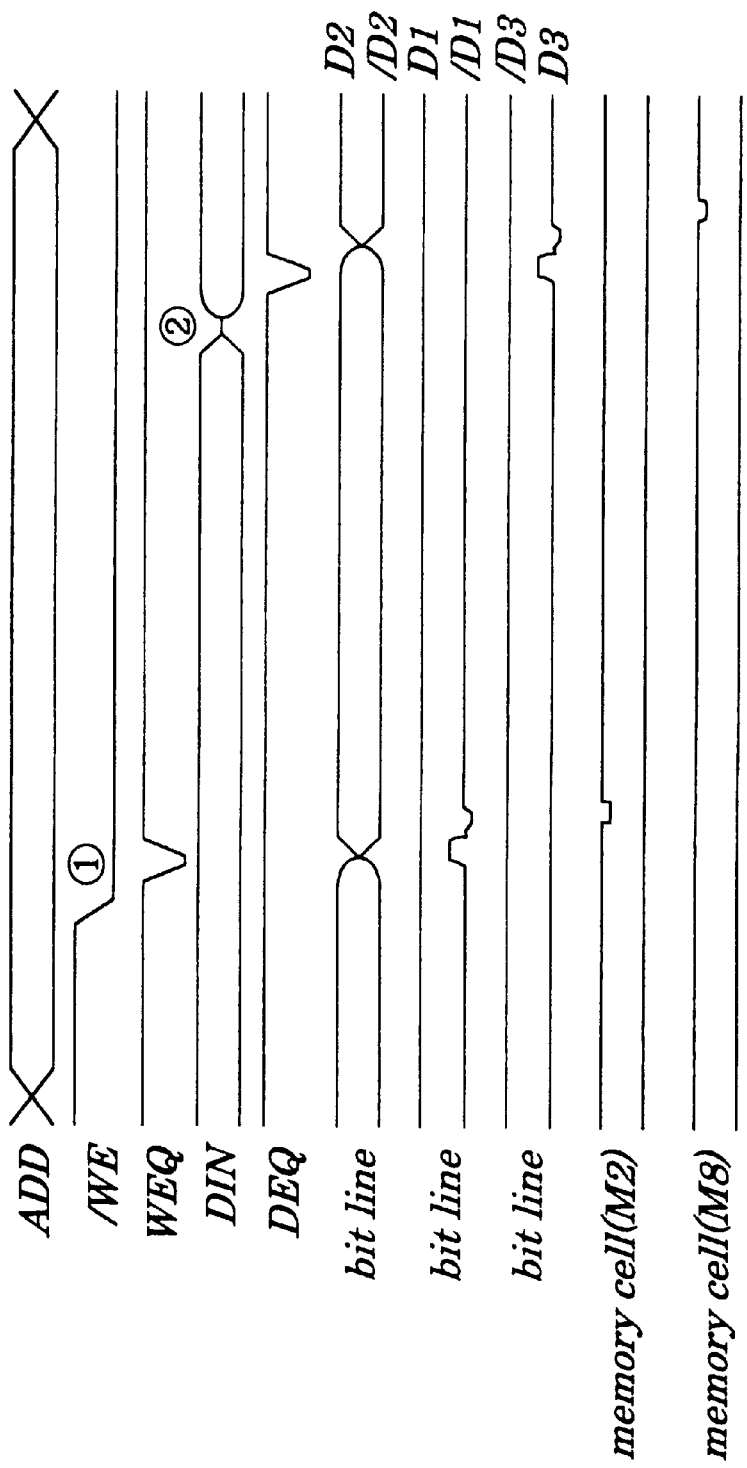
FIG. 13 is a timing chart illustrating operation of an SRAM as the third prior art.

FIG. 4 illustrates an arrangement of the memory cells of an SRAM according to a second preferred embodiment of the present invention.

The present embodiment exemplarily demonstrates an 8 I/O product, in which diodes and N-type transistors of the error writing protection circuit 10 in the circuit diagram of the memory cells in FIG. 2 uses a pair of two diodes and a pair of N-type transistors, respectively.

Bit lines are arranged such that D1 to /D8 take the same address and separate I/Os.

In this case, although line capacitance between the bit lines occurs in the same manner as in the foregoing first embodiment, write operations are simultaneously performed, so that the electric potential of the bit lines become minus owing to the line capacitance, whereby there is eliminated the possibility of any information being written into the memory ells in error.

There is therefore eliminated the need for providing the error writing protection circuit in D1 to D8.

More specifically, a chip area can be further reduced by providing the error writing protection circuit only on bit lines where row addresses are changed.

It is thus apparent that the present invention is not limited to the above embodiments but may be changed and modified without departing from the scope and spirit of the invention.

Finally, the present application claims the priority based on Japanese Patent Application No. Hei10-310588 filed on Oct. 30, 1998, which is herein incorporated by reference.

What is claimed is:

1. A semiconductor memory device provided with an error writing protection circuit, said error writing protection circuit comprising:

a pair of N-type transistors provided between a pair of bit lines;

a plurality of diodes, each said diode connected with each of said N-type transistors; and a driving P-type transistor connected with said each diode; and wherein said error writing protection circuit is adapted between said pair of bit lines in a cross-shape, so as to charge an adjacent bit line in accordance with an electric potential of a memory cell when writing data into said memory cell.

2. A semiconductor memory device comprising:

an error writing protection circuit for charging a bit line to prevent any memory cell from being erroneously written thereinto owing to wiring capacitance between adjacent bit lines upon writing any information into another memory cell, said error writing protection circuit being adapted such that determination of whether or not said bit line is charged is performed in accordance with an electric potential of said adjacent bit line and comprising a pair of N-type transistors located between the bit lines, diodes each being connected with the N-type transistors, and a driving P-type transistor.

3. The semiconductor memory device according to claim 1, wherein when a potential of bit lines of the memory cells on the side where any information is written are changed from high to low, the bit line of the memory cell having a low electric potential on the side where any information is not written is slightly charged with electricity.

4. The semiconductor memory device according to claim 1, wherein said plurality of the bit lines has a same address but different I/Os, and that said error writing protection circuit is provided only for bit lines where row addresses are changed.

5. The semiconductor memory device according to claim 1, wherein said memory cell comprises four transistors.

6. The semiconductor memory device according to claim 5, wherein said device is integrated into an SRAM using a memory cell array wherein said memory cells are arranged.

7. The semiconductor memory device according to claim 2, wherein when a potential of bit lines of the memory cells on the side where any information is written are changed from high to low, the bit line of the memory cell having a low electric potential on the side where any information is not written is slightly charged with electricity.

8. The semiconductor memory device according to claim 2, wherein said plurality of the bit lines has a same address but different I/Os, and that said error writing protection circuit is provided only for bit lines where row addresses are changed.

9. The semiconductor memory device according to claim 2, wherein said memory cell comprises four transistors.

10. The semiconductor memory device according to claim 9, wherein said device is integrated into an SRAM using a memory cell array wherein said memory cells are arranged.

* * * * *